United States Patent
Sewell

(10) Patent No.: US 10,622,227 B2
(45) Date of Patent: Apr. 14, 2020

(54) MULTI-AXIS FLATTENING TOOL AND METHOD

(71) Applicant: SUNPOWER CORPORATION, San Jose, CA (US)

(72) Inventor: Richard Hamilton Sewell, Los Altos, CA (US)

(73) Assignee: SunPower Corporation, San Jose, CA (US)

( * ) Notice: Subject to any disclaimer, the term of this patent is extended or adjusted under 35 U.S.C. 154(b) by 459 days.

(21) Appl. No.: 15/201,057

(22) Filed: Jul. 1, 2016

(65) Prior Publication Data

US 2018/0005855 A1    Jan. 4, 2018

(51) Int. Cl.
  *B21D 1/06* (2006.01)
  *H01L 21/67* (2006.01)
  *H01L 31/18* (2006.01)
  *H01L 21/683* (2006.01)

(52) U.S. Cl.
  CPC .......... *H01L 21/67092* (2013.01); *B21D 1/06* (2013.01); *H01L 21/6838* (2013.01); *H01L 31/186* (2013.01)

(58) Field of Classification Search
  CPC ... B21D 1/00; B21D 1/06; B21D 1/10; B21D 31/005; H01L 21/67092; H01L 31/186
  See application file for complete search history.

(56) References Cited

U.S. PATENT DOCUMENTS

| 5,164,019 A | 11/1992 | Sinton |
| 2008/0216887 A1 | 9/2008 | Hacke et al. |
| 2012/0204938 A1 | 8/2012 | Hacke et al. |

FOREIGN PATENT DOCUMENTS

| CN | 104353703 A | * | 2/2015 | ............... B21D 1/00 |
| DE | 10020412 A1 | | 11/2001 | |

OTHER PUBLICATIONS

Shoals Technologies Group, "Balances of Systems Product Catalog 2014", Shoals Technologies Group, sales@shoals.com, 36 pages.

* cited by examiner

*Primary Examiner* — Debra M Sullivan
(74) *Attorney, Agent, or Firm* — Schwabe, Williamson & Wyatt, P.C.

(57) ABSTRACT

A multi-axis flattening tool and method are described. In an example, the multi-axis flattening tool includes a support structure to constrain a bowed wafer along a support perimeter, and a pair of flattening structures independently movable relative to the support structure. For example, a first flattening structure may grip the wafer within the support perimeter and move axially relative to the support structure to bend the wafer about a first plane, and a second flattening structure may grip the wafer within the support perimeter and move axially relative to the support structure to bend the wafer about a second plane orthogonal to the first plane. The multi-axis bending of the wafer may flatten the wafer.

20 Claims, 7 Drawing Sheets

MULTI-AXIS FLATTENING TOOL AND METHOD

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are coupled to metal contacts on the solar cell to direct an electrical current from the cell to an external circuit coupled thereto. Generally, an array of solar cells, each solar cell interconnected, is mounted on a common or shared platform to provide a photovoltaic module. A photovoltaic module may be composed of a photovoltaic laminate. A plurality of photovoltaic modules or module groups may be electrically coupled to an electrical power distribution network, forming a photovoltaic system.

DETAILED DESCRIPTION

Figure 1A:
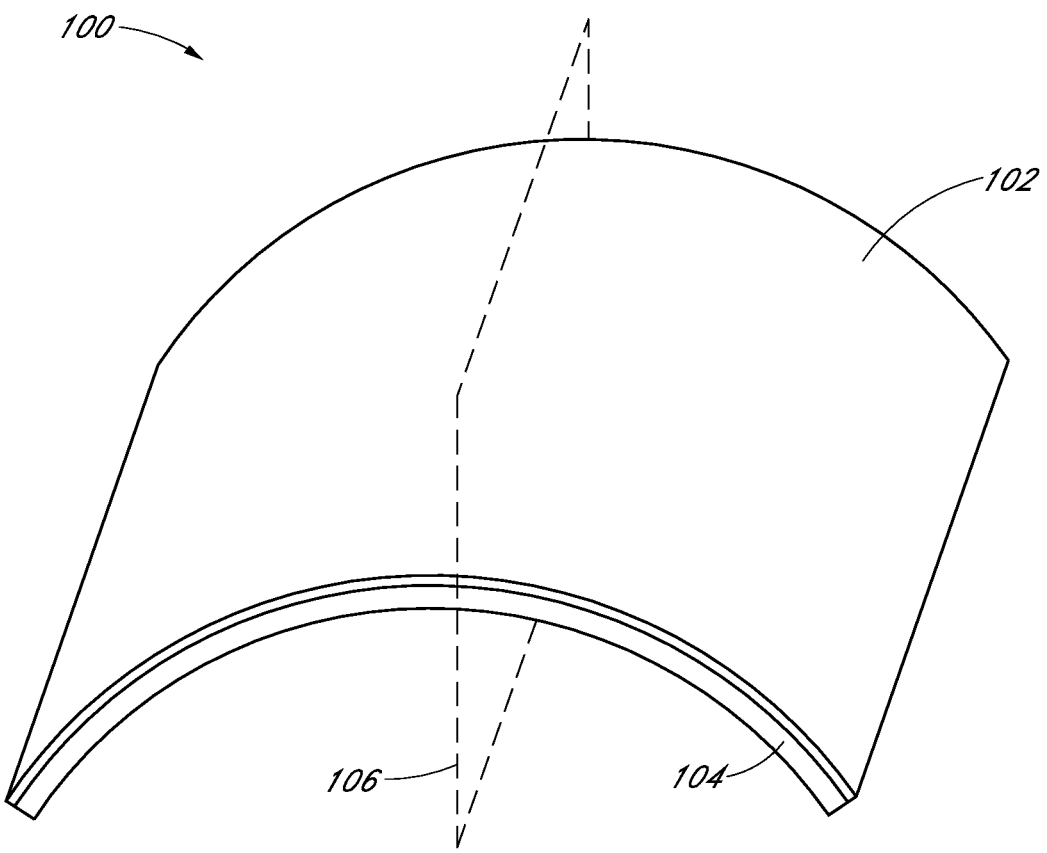
FIGS. 1A-1B illustrate perspective views of a bowed wafer, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" plane of symmetry does not necessarily imply that this plane is the first plane in a sequence; instead the term "first" is used to differentiate this plane from another plane (e.g., a "second" plane of symmetry).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper," "lower," "above," "below," "in front of," and "behind" refer to directions in the drawings to which reference is made. Terms such as "front," "back," "rear," "side," "outboard," "inboard," "leftward," and "rightward" describe the orientation and/or location of portions of a component, or describe the relative orientation and/or location between components, within a consistent but arbitrary frame of reference which is made clear by reference to the text and the associated drawings describing the component(s) under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Although discussed in the context of flattening bowed wafers, the multi-axis flattening tool and method described herein may be equally applicable to, but by no means limited to, other uses. For example, the multi-axis flattening tool may be used in a method of breaking apart a substrate. In a particular application, the multi-axis flattening tool may bend a substrate containing multiple monolithic diodes, and the bending may be about several planes of symmetry to break the substrate and separate the multiple monolithic diodes into individual parts.

Wafer-based PV cells can include a metallization layer laminated on a silicon substrate. For example, an aluminum foil may be bonded to the silicon substrate during a process having a high thermal budget, e.g., 450° C. Coefficients of thermal expansion of the silicon substrate and the metallization layer may differ, and thus, expansion and contraction of the silicon substrate and the metallization layer may differ during and after the bonding process. For example, as the PV cell cools after bonding, the silicon substrate and the metallization layer may shrink at different rates, and the PV cell may undergo biaxial strain. Furthermore, the metallization layer may stretch initially, but at a certain point, the metallization layer may stop stretching. Thus, the PV cell may bow based on a direction of maximum residual stress in the metallization layer. Such curvature of the PV cell can result in sub-optimal cell performance and difficulties in handling the PV cell during the cell and module production process.

Existing tools and methods for flattening photovoltaic (PV) cells include vacuum belt or roller systems that may bend a wafer along a single axis. Such tools, however, may not bend the wafer sufficiently to induce plastic deformation that counteracts the residual stress in the metallization layer. Furthermore, since such tools only bend the wafer along a single axis, relieving residual stress along a second axis requires several machines and/or rotating and passing the wafer through a single machine twice. Thus, providing a tool to flatten a PV cell having a curvature due to biaxial residual stress can improve manufacturing yields and product performance.

In an aspect, a multi-axis flattening tool may be used to plastically deform a metallization layer of a PV cell to relieve residual stresses induced during bonding of the PV cell to a metal foil, e.g., by thermocompression bonding aluminum foil to the PV cell or laser welding aluminum foil to the PV cell. More particularly, the multi-axis flattening tool may bow the metallization layer about a first plane of symmetry to reduce residual stress along a first axis, and the flattening tool may bow the metallization layer about a second plane of symmetry to reduce residual stress along a second axis. Furthermore, the dual-plane bowing may be performed without releasing a grip, e.g., by breaking a vacuum grip, on the PV cell. Accordingly, residual stress in the PV cell may be reduced, and furthermore, the stress reduction may be performed using a minimum number of handling operations in a time efficient manner.

The aspects described above may be realized by the multi-axis flattening tool and method disclosed herein. In the following description, numerous specific details are set forth, such as specific material regimes and component structures, in order to provide a thorough understanding of embodiments of the present disclosure. It will be apparent to one skilled in the art that embodiments of the present disclosure may be practiced without these specific details. In other instances, well-known fabrication techniques or component structures, such as specific types of actuators or techniques for coupling such actuators with system components, are not described in detail in order to not unnecessarily obscure embodiments of the present disclosure. Furthermore, it is to be understood that the various embodiments shown in the figures are illustrative representations and are not necessarily drawn to scale.

By way of summary, disclosed herein is a multi-axis flattening tool that may be used to bend a PV cell, e.g., a wafer-based PV cell, along two axes, i.e., about two planes of symmetry. Accordingly, the tool may reduce residual stress in a metallization layer of the PV cell to flatten the PV cell. In an embodiment, a multi-axis flattening tool includes a support structure coupled to a first flattening structure and a second flattening structure. The support structure may include several support grippers arranged along a support perimeter on a transverse plane. Furthermore, the first flattening structure and the second flattening structure may include respective grippers, i.e., first grippers and second grippers, arranged with the support perimeter. The first grippers may be arranged, e.g., symmetrically, about a first axial plane, and the second grippers may be arranged, e.g., symmetrically, about a second axial plane orthogonal to the first axial plane. Accordingly, movement of the first flattening structure relative to the support structure may cause a wafer gripped by the support grippers and the first grippers to bend about the first axial plane. As described below, bending about an axial plane can mean that the wafer assumes a bow, i.e., a curvature, that is within a plane perpendicular to the plane about which the wafer bends. For example, when the curvature of the bowed wafer is within an X-Z plane, the wafer may be considered to be bent about a Y-Z plane perpendicular to the X-Z plane. Similarly, movement of the second flattening structure relative to the support structure may cause the wafer gripped by the support grippers and the second grippers to bend about the second axial plane. In one embodiment, the multi-axis flattening tool includes several multi-axis grippers arranged within a multi-axis perimeter defined by the first grippers and the second grippers. The multi-axis grippers may be coupled to both the first flattening structure and the second flattening structure. Thus, the multi-axis grippers may participate in bending the wafer about both the first axial plane and the second axial plane when the first flattening structure or the second flattening structure are moved relative to the support structure.

Also by way of summary, disclosed herein is a method of using a multi-axis flattening tool to flatten a PV cell. In an embodiment, the support grippers are pressed against the wafer along the support perimeter on the transverse plane, e.g., when the bowed wafer is held in a flat shape by a separate vacuum chucking station. The first grippers, the second grippers, and/or the multi-axis grippers may attach to the wafer within the support perimeter. For example, the grippers may include a vacuum cup having a bellows with several folds, and suction may be applied to the wafer through a vacuum port in the vacuum cup. The first grippers, the second grippers, or the multi-axis grippers may be moved to bow the wafer about the first axial plane and the second axial plane. For example, the first grippers and the multi-axis grippers may move relative to the support grippers to bow the wafer about the first axial plane, and the second grippers and the multi-axis grippers may move relative to the support grippers to bow the wafer about the second axial plane. Accordingly, the wafer may be bent about two planes to relieve residual stress along two axes and to flatten the bowed wafer.

Referring to FIG. 1A, a perspective view of a bowed wafer is shown in accordance with an embodiment of the present disclosure. A wafer-based PV cell includes wafer 100 having a laminate structure. The laminate structure may include a silicon substrate 102 bonded to a metallization layer 104. For example, wafer 100 may include a metal foil, e.g., an aluminum or copper foil, laminated, welded, or otherwise bonded onto silicon substrate 102. Residual stress induced by a bonding process in metallization layer 104 may cause wafer 100 to bow about a first axial plane 106. That is, metallization layer 104 may have a maximum residual stress along an axis orthogonal to first axial plane 106, and thus, metallization layer 104 may bow about first axial plane 106 to reduce strain energy within the metal foil.

Figure 1B:
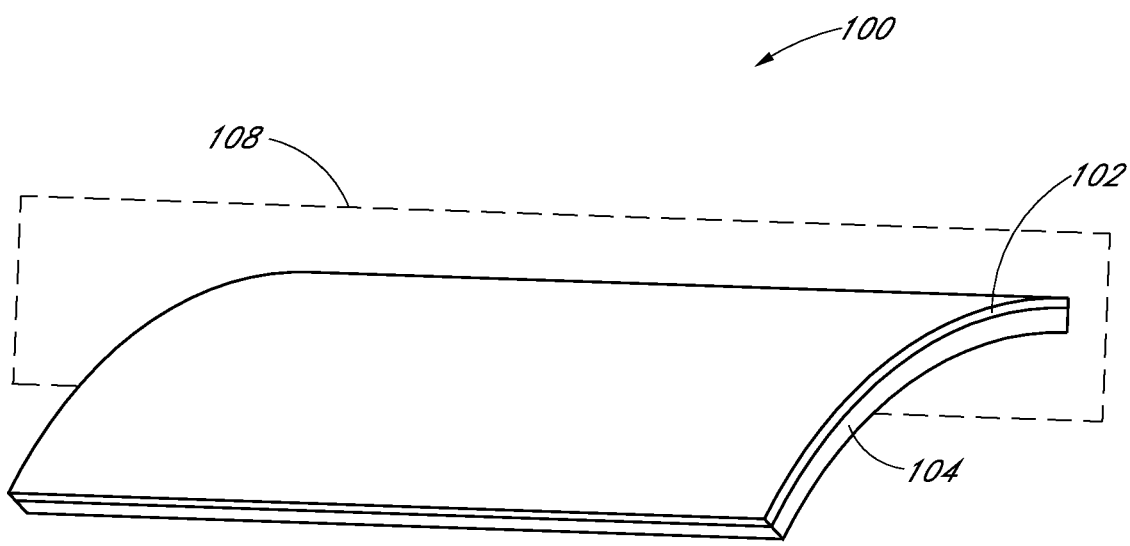

Referring to FIG. 1B, a perspective view of a bowed wafer is shown in accordance with an embodiment of the present disclosure. Residual stress within metallization layer 104 may be biaxial, i.e., may have a component along the axis orthogonal to first axial plane 106 and along an axis orthogonal to a second axial plane 108 perpendicular to first axial plane 106. Residual stress along each axis may be reduced by bending wafer 100 in a direction opposite to the residual curvature. For example, by bending wafer 100 about first axial plane 106 opposite to the curvature of the bow shown in FIG. 1A, residual stress orthogonal to first axial plane 106 may be reduced. When stress is released along one axis, however, wafer 100 may bow along a second axis that becomes an axis of maximum residual stress. More particularly, as shown in FIG. 1B, wafer 100 may bow about second axial plane 108 when metallization layer 104 is plastically deformed to relieve stress about first axial plane 106. Accordingly, wafer 100 may be bent about second axial plane 108 to plastically deform metallization layer 104 and further flatten wafer 100.

Figure 2:
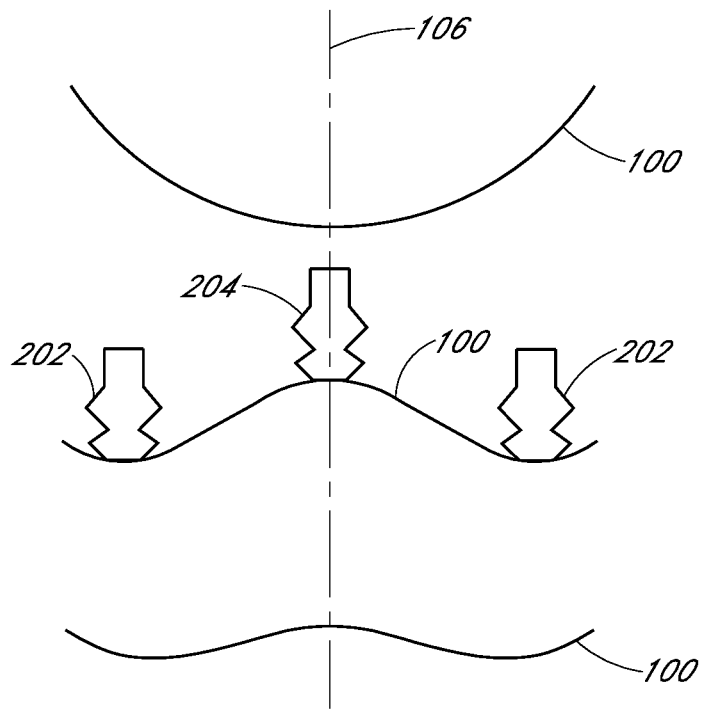
FIG. 2 illustrates a schematic representation of a wafer flattening process, in accordance with an embodiment of the present disclosure.

Referring to FIG. 2, a schematic representation of a wafer flattening process is shown in accordance with an embodiment of the present disclosure. Several frames are shown to represent different moments during the wafer flattening process. For example, the upper frame represents wafer 100 having a concave upward curvature about first axial plane 106.

The middle frame of FIG. 2 represents wafer 100 undergoing three point bending. More particularly, in an embodiment, several supports 202 may be arranged along an outer edge of wafer 100, and a gripper 204 may grip wafer 100 laterally between supports 202. For example, gripper 204 may attach to metallization layer 104 of wafer 100 at a point where first axial plane 106 intersects wafer 100. Accordingly, gripper 204 may apply a point load to wafer 100, e.g., may pull up on the panel, while supports 202 constrain the panel edges such that wafer 100 deflects along first axial plane 106. Deflection of wafer 100 may plastically deform metallization layer 104 beyond a plane of flatness. More particularly, wafer 100 may bow upward to have a radius of curvature about first axial plane 106 opposite of a radius of curvature of metallization layer 104 in the upper frame of FIG. 2.

The lower frame of FIG. 2 represents wafer 100 after the three point bending process. Plastic deformation of metallization layer 104 may relieve stress about first axial plane 106, and thus, wafer 100 may be more flat after three point bending than before. Wafer 100 may, however, still have residual curvature. That is, a flatness of wafer 100 after three point bending may not be absolute, and one or more residual bows may exist in a direction orthogonal to first axial plane 106.

Figure 3:
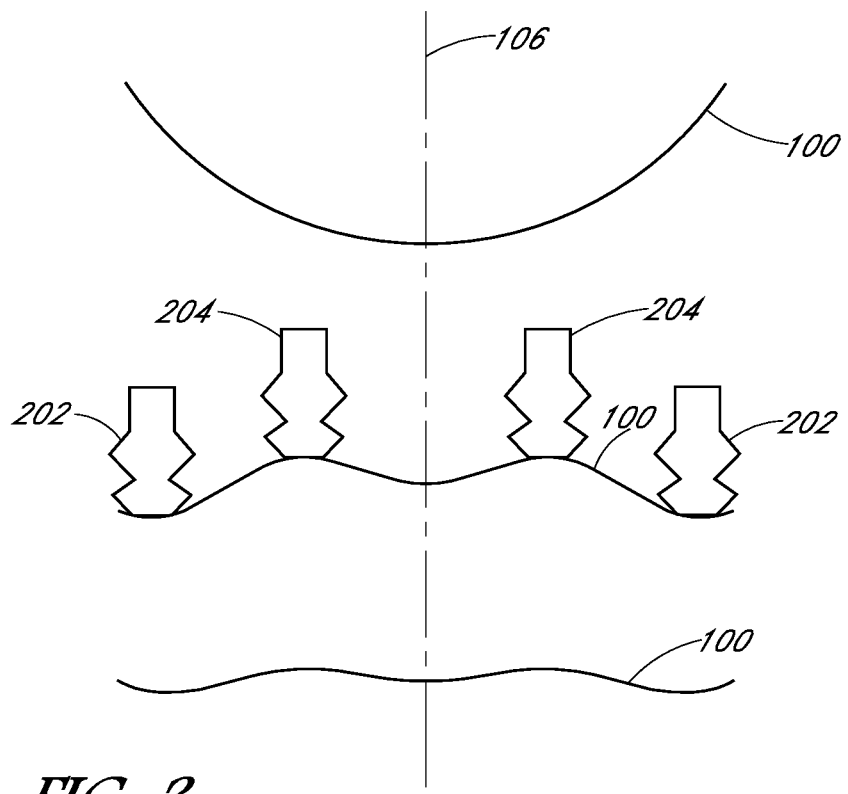
FIG. 3 illustrates a schematic representation of a wafer flattening process, in accordance with an embodiment of the present disclosure.

Referring to FIG. 3, a schematic representation of a wafer flattening process is shown in accordance with an embodiment of the present disclosure. Increasing a number of grippers 204 used to deform wafer 100 may result in a flatter surface morphology of wafer 100 after a bending process. For example, wafer 100 having the concave upward shape shown in the upper frame may be subjected to a four point bending process. The four point bending process shown in the middle frame may include supports 202 along opposite edges of wafer 100, and several grippers 204 attached to a surface of wafer 100 between supports 202. More particularly, the four point bending process may include a pair of grippers 204 symmetrically arranged about first axial plane 106 within a support perimeter defined by supports 202. The pair of grippers 204 may be symmetric relative to first axial plane 106 because each gripper 204 is separated from first axial plane 106 by a same distance. By way of example, each gripper 204 may attach to the surface of wafer 100 at a point equidistant between first axial plane 106 and support 202 on a same side of first axial plane 106. Accordingly, when grippers 204 deflect wafer 100, e.g., by pulling upward on metallization layer 104, wafer 100 may bend symmetrically about first axial plane 106. Plastic deformation of metallization layer 104 may relieve stress about first axial plane 106, and as shown in the lower frame, an average or peak-to-peak flatness of wafer 100 after the four point bending process illustrated in FIG. 3 may be less than, i.e., more flat than, wafer 100 having residual curvature after the three point bending process illustrated in FIG. 2. It may thus be concluded that a wafer bending process having more grippers 204 arranged about first axial plane 106 may result in a flatter surface morphology after plastically deforming metallization layer 104.

As described above, metallization layer 104 may be plastically deformed in two directions to improve a flatness of wafer 100. More particularly, the bending processes represented schematically in FIGS. 2 and 3 may be used to bend wafer 100 about second axial plane 108, and thus, the laminate structure may be de-bowed in two directions to flatten wafer 100. For example, experiments have indicated that after a laminate bonding process, a rectangular wafer 100 having an edge with a width and a length of 156 mm may include a residual curvature having a sagitta, i.e., an arc depth, of 4.5 mm. After using a multi-axis flattening tool to deform metallization layer 104 about several axial planes, however, the sagitta of the experimental wafer 100 was decreased by more than half, e.g., to 2 mm.

Figure 4:
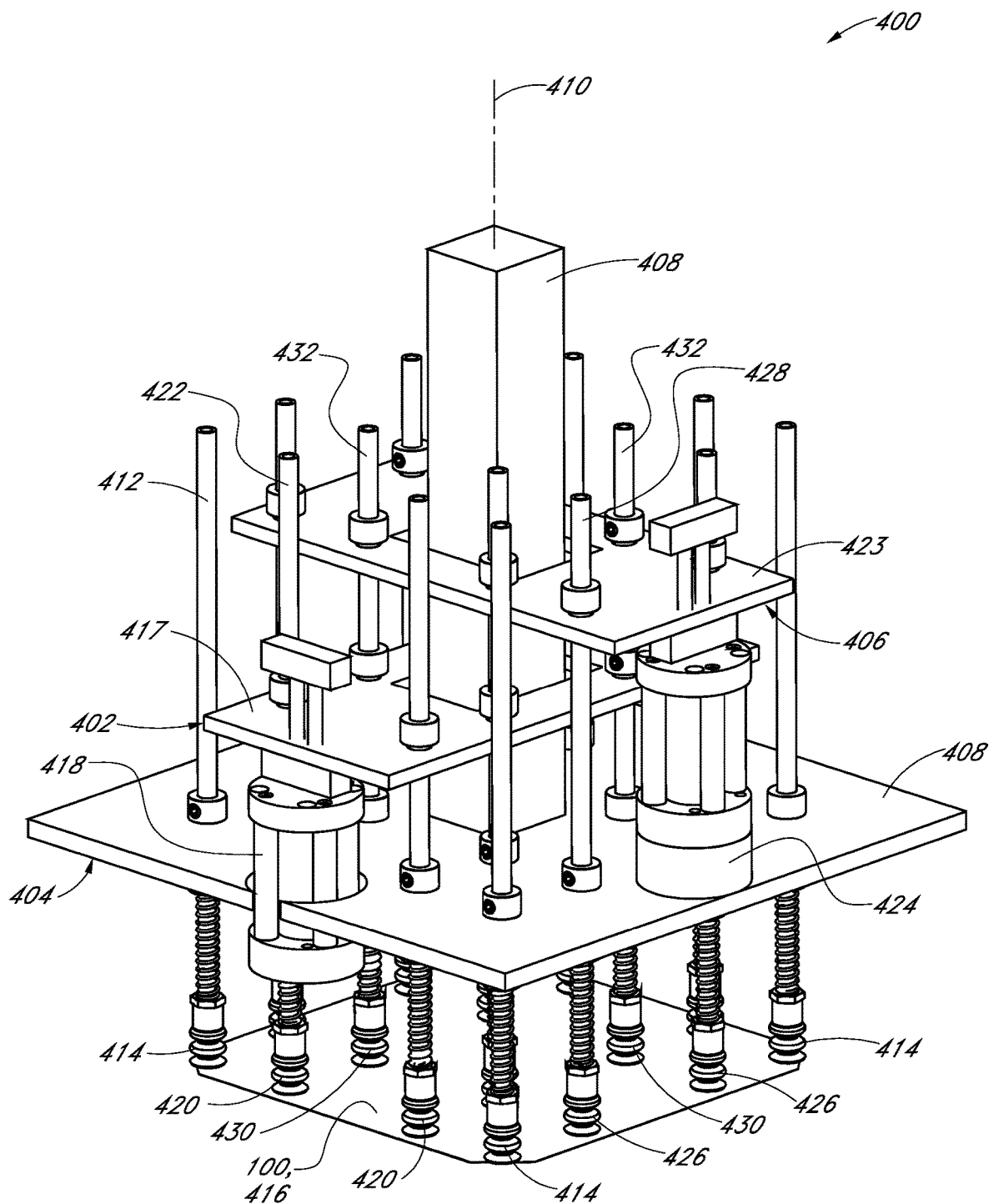
FIG. 4 illustrates a perspective view of a multi-axis flattening tool, in accordance with an embodiment of the present disclosure.

Referring to FIG. 4, a perspective view of a multi-axis flattening tool is shown in accordance with an embodiment of the present disclosure. A multi-axis flattening tool 400 may include mechanisms to support and grip wafer 100 across a wafer surface, and to bend wafer 100 about one or more axial planes to relieve residual stress along one or more axes. Furthermore, the mechanisms of multi-axis flattening tool 400 may be independently actuated, e.g., a first flattening structure 402 may move relative to a support structure 404 to relieve stress in a direction of first axial plane 106 and a second flattening structure 406 may move relative to support structure 404 to relieve stress in a direction of second axial plane 108, such that multi-axis flattening tool 400 may engage wafer 100 only once, and bend wafer 100 in two directions without having to pass or rotate wafer 100 through multi-axis flattening tool 400 twice. That is, multi-axis flattening tool 400 enables biaxial stress relief to be performed on wafer 100 in a single machine platform.

In an embodiment, multi-axis flattening tool 400 includes support structure 404 that serves as a frame of reference for other structures of the tool. For example, support structure 404 may include a support frame 408 that is fixed to an external datum, e.g., an equipment chassis resting on a manufacturing floor. By way of example, support frame 408 may be fixed to the external datum by a column extending between a horizontal plate structure and the datum in an axial direction 410. In an embodiment, support frame 408 may be incorporated into a wafer transfer arm or robot end effector such that the wafer may be picked up from one location in a production tool and deposited in a different location. In such case, the multi-axis flattening tool 400 would be within a moving frame of reference, and thus, the flattening operations described herein may be performed while multi-axis flattening tool 400 and a wafer carried by multi-axis flattening tool 400 are moving relative to an external stationary frame of reference, e.g., the equipment chassis resting on the manufacturing floor. Thus, other structures of multi-axis flattening tool 400 may be moved relative to support frame 408 and/or relative to an external datum.

Support structure 404 may include several support grippers 414. More particularly, several support shafts 412 may extend vertically from the horizontal plate of support frame 408 to respective support grippers 414. Support frame 408 may be coupled to support grippers 414 by support shafts 412, and support grippers 414 may be offset from support frame 408 in axial direction 410. Accordingly, support grippers 414 may be arranged along a transverse plane 416 vertically offset from support frame 408.

Support grippers 414 may be pressed against wafer 100 when wafer 100 is flat, such as when bowed wafer 100 is held flat by a vacuum chuck station, and the locations at which support grippers 414 apply a point load to wafer 100 may be along an outer edge of wafer 100. Curvature at the outer edge of wafer 100 may complicate loading of wafer 100 into a cassette that is used for further downstream processing. That is, edge curvature may make insertion of a bowed wafer 100 into the cassette difficult. Thus, support grippers 414 may be located on or within several millimeters of the outer edge such that the edge curvature is inward from support grippers 414.

Figure 6:
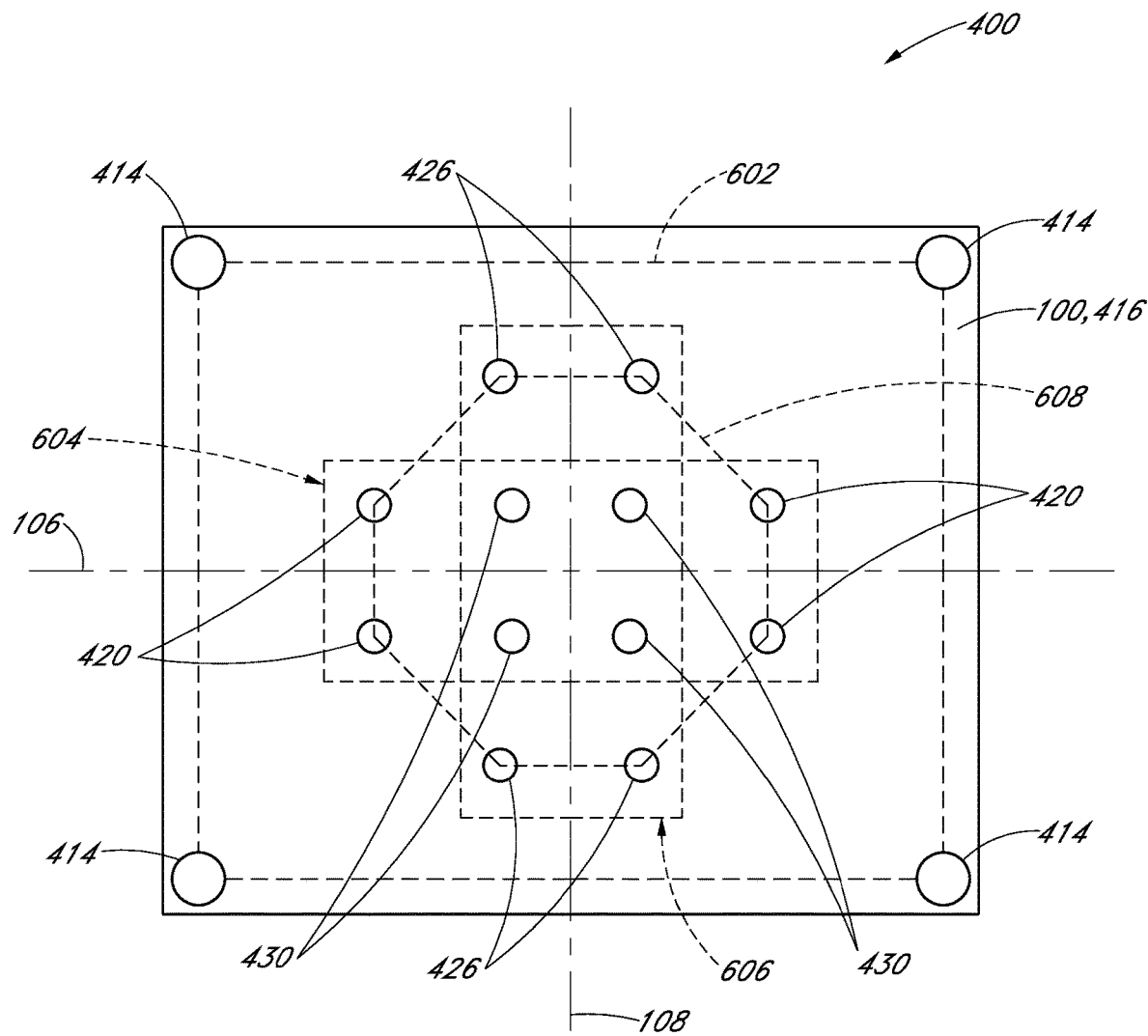
FIG. 6 illustrates a bottom view of a multi-axis flattening tool, in accordance with an embodiment of the present disclosure.

Multi-axis flattening tool 400 may include support grippers 414 located at each corner of a target wafer 100. Thus, when wafer 100 has a rectangular shape, multi-axis flattening tool 400 may include four or more support grippers 414 evenly distributed along the side edges of the rectangular shape. Similarly, when wafer 100 has a circular shape, support grippers 414 may be evenly distributed along the circumferential edge of the wafer 100. A geometric reference line may extend through the interface between support grippers 414 and wafer 100, i.e., the locations at which support grippers 414 press against wafer 100. The geometric reference line may be referred to as a support perimeter (FIG. 6). Thus, support grippers 414 may be arranged along the support perimeter on transverse plane 416.

In an embodiment, multi-axis flattening tool 400 includes first flattening structure 402 that is movable relative to support structure 404. For example, first flattening structure 402 may include a first frame 417, and a first actuator 418 may extend between first frame 417 and support frame 408 to couple first flattening structure 402 to support structure 404. More particularly, first actuator 418 may include a fixed end connected to support frame 408, and a moving end connected to first frame 417. First actuator 418 may be a linear actuator, e.g., a pneumatic, electric, or hydraulic actuator. Thus, first actuator 418 may be actuated to move first frame 417 in axial direction 410 relative to support frame 408.

First flattening structure 402 may include several first grippers 420. More particularly, several first shafts 422 may extend vertically from a horizontal plate structure of first frame 417 to respective first grippers 420. First frame 417 may be coupled to first grippers 420 by first shafts 422, and first grippers 420 may be offset from first frame 417 in axial direction 410. Accordingly, in at least one relative position between first frame 417 and support frame 408, first grippers 420 may be arranged along transverse plane 416 coplanar with support grippers 414. As described below, multi-axis flattening tool 400 may include first grippers 420 arranged within the geometric reference line, i.e., the support perimeter, extending through support grippers 414. Accordingly, when support grippers 414 and first grippers 420 are attached to wafer 100 and first frame 417 is moved relative to support frame 408, e.g., upward, wafer 100 may bow in the direction of movement between support grippers 414 and first grippers 420.

In an embodiment, multi-axis flattening tool 400 includes second flattening structure 406 that is movable relative to support structure 404. For example, second flattening structure 406 may include a second frame 423, and a second actuator 424 may extend between second frame 423 and support frame 408 to couple second flattening structure 406 to support structure 404. More particularly, second actuator 424 may include a fixed end connected to support frame 408, and a moving end connected to second frame 423. Second actuator 424 may be a linear actuator, e.g., a pneumatic, electric, or hydraulic actuator. Thus, second actuator 424 may be actuated to move second frame 423 in axial direction 410 relative to support frame 408.

Second flattening structure 406 may include several second grippers 426. More particularly, several second shafts 428 may extend vertically from a horizontal plate structure of second frame 423 to respective second grippers 426. Second frame 423 may be coupled to second grippers 426 by second shafts 428, and second grippers 426 may be offset from second frame 423 in axial direction 410. Accordingly, in at least one relative position between second frame 423 and support frame 408, second grippers 426 may be arranged along transverse plane 416 coplanar with support grippers 414. As described below, multi-axis flattening tool 400 may include second grippers 426 arranged within the geometric reference line, i.e., the support perimeter, extending through support grippers 414. Accordingly, when support grippers 414 and second grippers 426 are attached to wafer 100 and second frame 423 is moved relative to support frame 408, e.g., upward, wafer 100 may bow in the direction of movement between support grippers 414 and second grippers 426.

In an embodiment, multi-axis flattening tool 400 includes several multi-axis grippers 430. More particularly, several multi-axis shafts 432 may extend vertically from the horizontal plate structures of both first frame 417 and second frame 423 to respective multi-axis grippers 430. Accordingly, first frame 417 and second frame 423 may be coupled to multi-axis grippers 430 by multi-axis shafts 432, and multi-axis grippers 430 may be offset from first frame 417 and second frame 423 in axial direction 410. More particularly, first frame 417 and second frame 423 may be coupled to respective collars mounted on multi-axis shafts 432 such that multi-axis shafts 432 and multi-axis grippers 430 lift when either first frame 417 or second frame 423 are moved upward to engage the collars. It is notable, however, that multi-axis shafts 432 may pass through clearance holes in both first frame 417 and second frame 423, and thus, the shafts may not be directly coupled to the frames. That is, the shafts may be indirectly coupled to the frames by the collars in that movement of first frame 417 may lift the collars and shafts, and movement of second frame may lift the collars and shafts, but first frame 417 and second frame 423 need not move together to lift the collars and shafts. In an embodiment, in at least one relative position between first frame 417 and support frame 408, or second frame 423 and support frame 408, multi-axis grippers 430 may be arranged along transverse plane 416 coplanar with support grippers 414.

A geometric reference line may extend through the interface between wafer 100 and both first grippers 420 and second grippers 426. That is, the locations at which first grippers 420 and second grippers 426 press against wafer 100 may define the geometric reference line, which may be referred to as a multi-axis perimeter (FIG. 6). Thus, first grippers 420 and second grippers 426 may be arranged along the multi-axis perimeter on transverse plane 416. As described below, multi-axis flattening tool 400 may include multi-axis grippers 430 arranged within the geometric reference line defining the multi-axis perimeter. Accordingly, when support grippers 414 and multi-axis grippers 430 are attached to wafer 100 and either first frame 417 or second frame 423 is moved relative to support frame 408, e.g., upward, wafer 100 may bow in the direction of movement between support grippers 414 and multi-axis grippers 430.

Each of the independent structures of multi-axis flattening tool 400, e.g., support structure 404, first structure 402, or second structure 406 may be adjustable. That is, each of the grippers 204 coupled to the structures, e.g., support grippers 414, first grippers 420, second grippers 426, or multi-axis grippers 430 may be repositionable such that the grippers 204 can be relocated along transverse plane 416. The repositionable grippers 204 may accommodate different wafer shapes and sizes. For example, support grippers 414 and support shafts 412 may be coupled to support frame 408 at different locations radially outward from the locations shown in FIG. 4 to expand the support perimeter and to support a different wafer 100 having a larger lateral dimension. Similarly, first grippers 420, second grippers 426, and multi-axis grippers 430, may be repositioned within the support perimeter to alter the curvature of wafer 100 during a flattening process. The positioning of the grippers may determine a final shape of wafer 100 after the flattening process.

Figure 5:
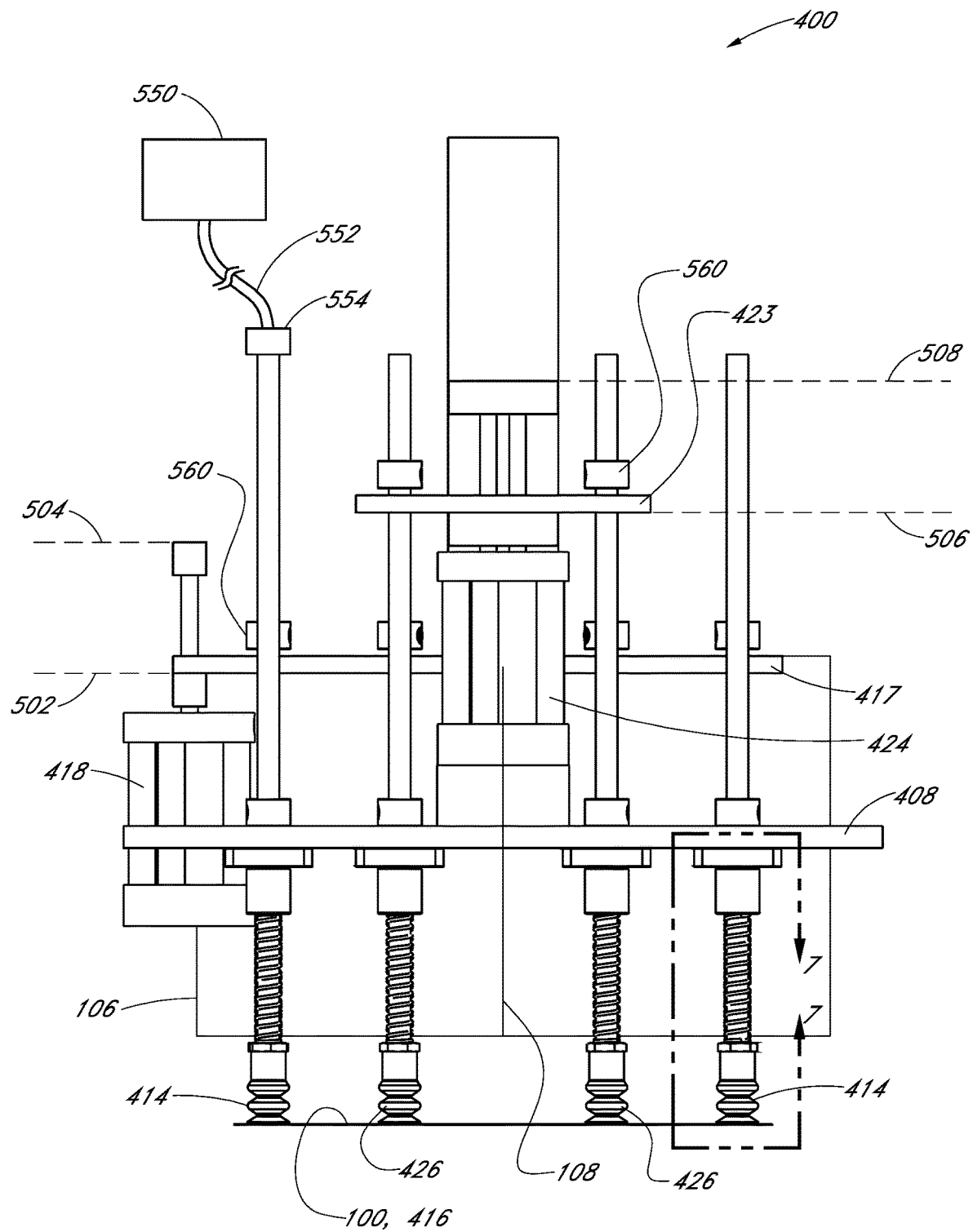
FIG. 5 illustrates a side view of a multi-axis flattening tool, in accordance with an embodiment of the present disclosure.

Referring to FIG. 5, a side view of a multi-axis flattening tool is shown in accordance with an embodiment of the present disclosure. The side view may be orthogonal to the first axial plane 106, e.g., a y-z plane, in a direction of second axial plane 108, e.g., an x-z plane. First axial plane 106 may also be orthogonal to both second axial plane 108 and transverse plane 416, e.g., an x-y plane, and thus, the side view may also be orthogonal to first axial plane 106 in a direction of transverse plane 416. In an embodiment, the respective plate structures of support frame 408, first frame 417, and second frame 423, are parallel to wafer 100 on transverse plane 416. First frame 417 and second frame 423 may be moved to different positions relative to support frame 408 to affect a vertical location of first grippers 420, second grippers 426, or multi-axis grippers 430.

In an embodiment, first actuator 418 may be actuated to move first frame 417 between a first flat position 502 and a first bow position 504. Thus, the first frame 417 has first flat position 502 relative to support frame 408 at a first vertical location, and first bow position 504 relative to support frame 408 at a second vertical location. First grippers 420 (hidden behind support grippers 414 in FIG. 5) may be coupled to first frame 417, e.g., by first shafts 422 passing through holes in support frame 408, and thus, first grippers 420 may move with first frame 417 when first actuator 418 drives first frame 417 between first flat position 502 and first bow position 504. Accordingly, when first frame 417 is in first flat position 502, first grippers 420 may be coplanar with support grippers 414, and when first frame 417 is in first bow position 504, first grippers 420 may be axially offset from support grippers 414. That is, when first frame 417 is in first bow position 504, first grippers 420 may be upward from support grippers 414 in axial direction 410.

In an embodiment, second actuator 424 may be actuated to move second frame 423 between a second flat position 506 and a second bow position 508. Thus, the second frame 423 has second flat position 506 relative to support frame 408 at a first vertical location, and second bow position 508 relative to support frame 408 at a second vertical location. Second grippers 426 may be coupled to second frame 423, e.g., by second shafts 428 passing through holes in support frame 408, and thus, second grippers 426 may move with second frame 423 when second actuator 424 drives second frame 423 between second flat position 506 and second bow position 508. Accordingly, when second frame 423 is in second flat position 506, second grippers 426 may be coplanar with support grippers 414, and when second frame 423 is in second bow position 508, second grippers 426 may be axially offset from support grippers 414. That is, when second frame 423 is in second bow position 508, second grippers 426 may be upward from support grippers 414 in axial direction 410.

Multi-axis grippers 430 (hidden behind second grippers 426 in FIG. 5) may be coupled to first frame 417 and second frame 423, e.g., by multi-axis shafts 432 passing through holes in first frame 417 and second frame 423, and thus multi-axis grippers 430 may move with either first frame 417 or second frame 423 when the frames are driven by respective actuators. For example, when first actuator 418 drives first frame 417 between first flat position 502 and first bow position 504, multi-axis shafts 432 may be driven upward to raise multi-axis grippers 430 from transverse plane 416. Similarly, when second actuator 424 drives second frame 423 between second flat position 506 and second bow position 508, multi-axis shafts 432 may be driven upward to raise multi-axis grippers 430 from transverse plane 416.

Referring to FIG. 6, a bottom view of a multi-axis flattening tool is shown in accordance with an embodiment of the present disclosure. It will be appreciated from the description above, that the grippers 204 of wafer flattening tool 400 may be arranged in sets depending on their location and respective movements when either first actuator 418 or second actuator 424 are driven. In an embodiment, a set of support grippers 414 are arranged along a support perimeter 602 on transverse plane 416. Support perimeter 602 may be a geometric reference line passing through respective axes of support grippers 414 and support shafts 412. Accordingly, support perimeter 602 may be rectangular when four support grippers 414 are present as shown, or support perimeter 602 may be another shape, e.g., an octagon when eight support grippers 414 are present and arranged in an octagon about a central axis.

A first set of grippers 604 (shown bundled by a dashed reference box) may be arranged within support perimeter 602 about first axial plane 106. More particularly, first set of grippers 604 may include first grippers 420 arranged within support perimeter 602 about first axial plane 106. First axial plane 106 may be orthogonal to transverse plane 416, and thus, first grippers 420 of first set may be distributed along transverse plane 416. In an embodiment, first grippers 420 include at least four grippers 204 arranged symmetrically about first axial plane 106. For example, first set 604 may include two first grippers 420 on a first side of first axial plane 106 and two first grippers 420 in a mirrored arrangement on a second side of first axial plane 106. Furthermore, first grippers 420 of first set may be mirrored about second axial plane 108, such that first set has a symmetrical arrangement on transverse plane 416.

A second set of grippers 606 (shown bundled by a dashed reference box) may be arranged within support perimeter 602 about second axial plane 108. More particularly, second set of grippers 606 may include second grippers 426 arranged within support perimeter 602 about second axial plane 108. Second axial plane 108 may be orthogonal to transverse plane 416 and first axial plane 106, and thus, second grippers 426 of second set 606 may be distributed along transverse plane 416. In an embodiment, second grippers 426 include at least four grippers 204 arranged symmetrically about second axial plane 108. For example, second set may include two second grippers 426 on a first side of second axial plane 108 and two second grippers 426 in a mirrored arrangement on a second side of second axial plane 108.

Multi-axis grippers 430 may form a portion of both first set of grippers 604 and second set of grippers 606. For example, first grippers 420 of first set of grippers 604 and second grippers 426 of second set of grippers 606 may define a geometric reference line within which multi-axis grippers 430 are located. More particularly, first grippers 420 and second grippers 426 may be arranged along a multi-axis perimeter 608. Multi-axis perimeter 608 may extend through first grippers 420 and second grippers 426, and thus, multi-axis perimeter 608 may be within support perimeter 602 extending through support grippers 414. Furthermore, multi-axis grippers 430 may be arranged within multi-axis perimeter 608, and thus, multi-axis grippers 430 may be arranged within support perimeter 602 by extension. As shown, multi-axis grippers 430 may be arranged about first axial plane 106 and second axial plane 108. For example, multi-axis grippers 430 may be arranged symmetrically about the central axis passing in axial direction 410 through transverse plane 416. In an embodiment, multi-axis flattening tool 400 includes at least four multi-axis grippers 430, and at least one multi-axis gripper 430 may be located in a respective quadrant of transverse plane 416 as defined by an intersection between first axial plane 106 and second axial plane 108.

The sets of grippers described above may be further segmented into subsets. For example, each set of grippers may include a respective subset of grippers that are moved by a single actuator, and each set of grippers may include a common subset of grippers that may be moved by two or more actuators. That is, each of first actuator 418 and second actuator 424 may be coupled to a respective subset of first set of grippers 604 or second set of grippers 606, and both actuators may be coupled to the common subset of first set of grippers 604 and second set of grippers 606. Accordingly, multi-axis perimeter 608 may extend through the respective subsets of first set of grippers 604, e.g., first grippers 420, and second set of grippers 606, e.g., second grippers 426, and the common subset, e.g., multi-axis grippers 430, may be located within multi-axis perimeter 608.

In an embodiment, first set of grippers 604 includes at least eight grippers 204 arranged symmetrically about first axial plane 106. For example, first set of grippers 604 may include first grippers 420 and multi-axis grippers 430 arranged in two rows of four grippers 204 on either side of first axial plane 106. First frame 417 may be coupled to first set of grippers 604 by first actuator 418. More particularly, first grippers 420 may be coupled to first frame 417 and multi-axis grippers 430 may be coupled to both first frame 417 and second frame 423. Thus, movement of first frame 417 when first actuator 418 is driven may lift first set of grippers 604 (both first grippers 420 and multi-axis grippers 430) to cause wafer 100 to bow about first axial plane 106. Accordingly, a single actuator, e.g., a pneumatic first actuator 418, may lift first set of grippers 604 to flatten wafer 100 about a first axis extending through first axial plane 106.

Second set of grippers 606 may include at least eight grippers 204 arranged symmetrically about second axial plane 108. For example, second set of grippers 606 may include second grippers 426 and multi-axis grippers 430 arranged in two rows of four grippers 204 on either side of second axial plane 108. Second frame 423 may be coupled to second set of grippers 606 by second actuator 424. More particularly, second grippers 426 may be coupled to second frame 423 and multi-axis grippers 430 may be coupled to both first frame 417 and second frame 423. Thus, movement of second frame 423 when second actuator 424 is driven may lift second set of grippers 606 (both second grippers 426 and multi-axis grippers 430) to cause wafer 100 to bow about second axial plane 108. Accordingly, a single actuator, e.g., a pneumatic second actuator 424, may lift second set of grippers 606 to flatten wafer 100 about a second axis extending through second axial plane 108. As such, wafer 100 may be flattened in two axes by multi axis flattening tool without being moved to a different flattening station.

Figure 7:
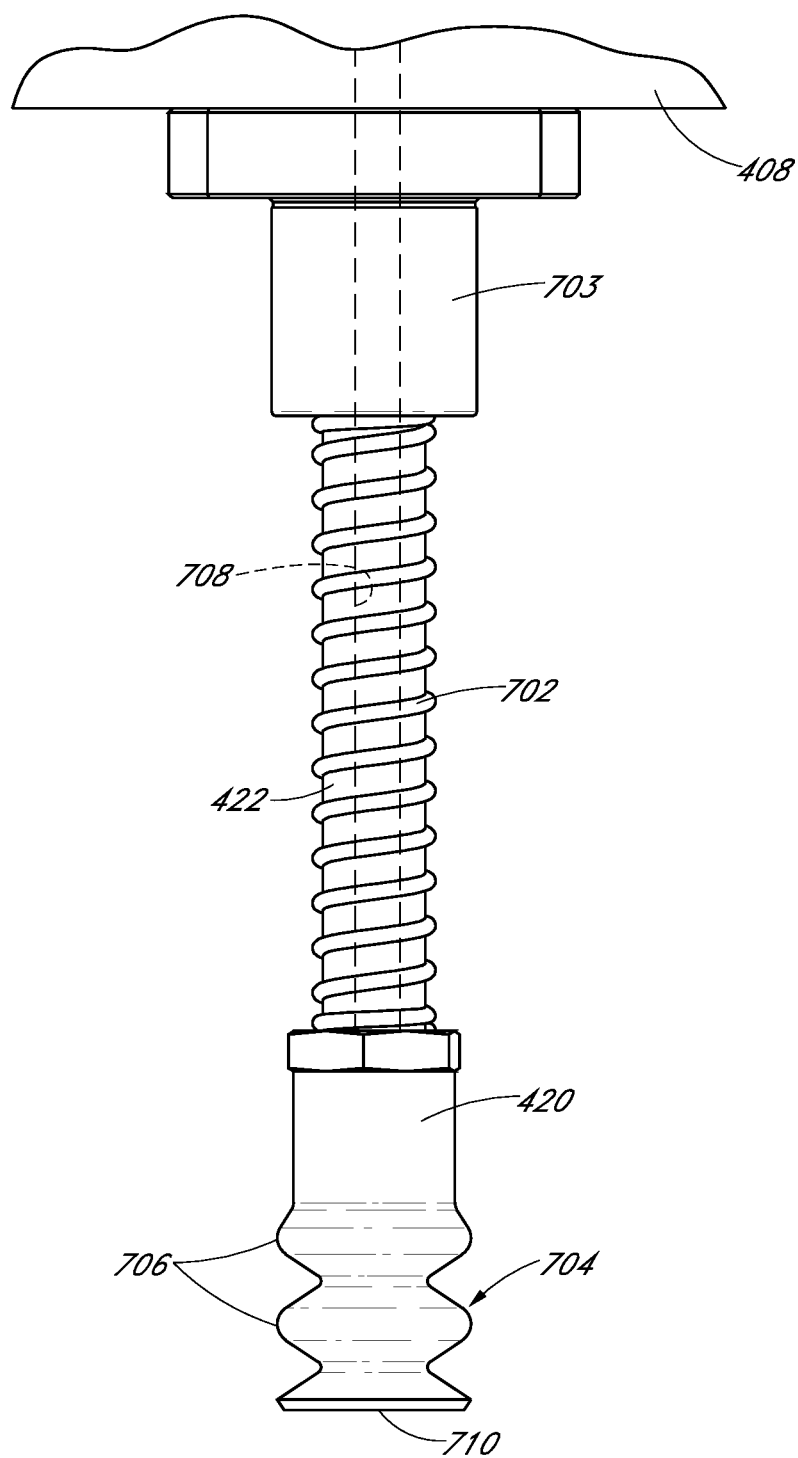
FIG. 7 illustrates a detail view, taken from Detail A of FIG. 5, of a spring-loaded gripper of a multi-axis flattening tool, in accordance with an embodiment of the present disclosure.

Referring to FIG. 7, a detail view, taken from Detail A of FIG. 5, of a spring-loaded gripper of a multi-axis flattening tool is shown in accordance with an embodiment of the present disclosure. Each gripper 204 of multi-axis flattening tool 400 may be spring-loaded, and may include a gripping mechanism to attach the gripper to a surface of wafer 100. The spring-loaded mechanism of the grippers 204 may function to absorb shocks caused by an impact between the gripper 204 and wafer 100. For example, a spring 702 may extend from support frame 408 to a gripper 204 of multi-axis flattening tool 400. First gripper 420 is shown in FIG. 7, by way of example only, and one or more springs 702 may extend from support frame 408 to one or more of support grippers 414, first grippers 420, second grippers 426, or multi-axis grippers 430. More particularly, spring 702 may have a first end secured relative to support frame 408, e.g., pressing against a linear bearing 703. Linear bearing 703 may be attached to support frame 408 to guide first shaft 422 through a hole. A second end of spring 702 may be similarly secured relative to first gripper 420, e.g., pressing against a lock nut used to attach first gripper 420 to first shaft 422. Accordingly, when first gripper 420 is lowered onto wafer 100, wafer 100 may press upward against first gripper 420 to cause first shaft 422 to slide within linear bearing 703, and the upward impact may be absorbed by spring 702 such that first gripper 420 can comply to wafer 100 without damaging the wafer surface.

Grippers 204 of multi-axis flattening tool 400 may include gripping mechanisms to attach to wafer 100. For example, grippers 204 may include electrostatic chucks, low-tackiness adhesives, mechanical fasteners, or suction cups to attach to the wafer surface. In an embodiment, one or more of support grippers 414, first grippers 420, second grippers 426, or multi-axis grippers 430 include a vacuum cup 704 to apply suction to the wafer surface. Vacuum cup 704 may be flexible. For example, vacuum cup 704 may include a bellows having several folds 706 to allow vacuum cups 704 to flex and comply to the wafer surface when the wafer surface is oblique to a vertical axis passing through a respective gripper shaft. For example, when wafer 100 is bent or curved, vacuum cup 704 having the bellows that includes two or more folds 706 may comply to the wafer surface and provide additional springiness to the gripper 204 such that the impact between the gripper 204 and wafer 100 does not damage the wafer 100, and a secure suction is achieved.

As shown in FIG. 5, vacuum cup 704 may be connected to a vacuum source 550. For example, vacuum source 550 may be a vacuum supply of a manufacturing facility, and the vacuum supply may be connected to a gripper shaft through a vacuum tube 552 and a vacuum coupling 554 attaching vacuum tube 552 to the gripper shaft. The suction lines may alternatively be connected directly to vacuum cup 704, e.g., through a side port in vacuum cup 704. In the case of suction lines being provided through the gripper shaft, a lumen 708 may extend through a respective one or more of support shafts 412, first shafts 422, second shafts 428, or multi-axis shafts 432 to a vacuum port 710. Thus, vacuum cup 704 may be connected to vacuum source 550 through lumen 708 to provide a suction through vacuum port 710. The suction may apply a point load to the wafer surface to grip wafer 100.

Vacuum cups 704 may be selected to avoid damage to wafer 100. For example, depending on a likely curvature of wafer 100 at a location where the gripper 204 presses against wafer 100, more or fewer folds 706 may be employed. For example, multi-axis grippers 430 may include bellows having more folds 706 than a number of folds 706 in bellows used for support grippers 414. Furthermore, a diameter of vacuum cups 704 may be small enough to reduce the likelihood of damage to wafer 100. For example, a diameter of vacuum cup 704 may be less than one inch, e.g., 12 mm, when a vacuum pressure of 1 Torr is used for suction.

Various actuation mechanisms may be employed to move gripper shafts. For example, as shown in FIG. 5, a collar 560 may be attached to a respective gripper shaft at a location between a flat position of a frame and a bow position of the frame. For example, collar 560 may be attached to first shaft 422 at a vertical location between first flat position 502 and first bow position 504. Thus, when first actuator 418 raises first frame 417 from first flat position 502 to first bow position 504, first frame 417 presses upward against collar 560 to lift first gripper 420. Similarly, collar 560 may be attached to second shaft 428 at a vertical location between second flat position 506 and second bow position 508. Thus when second actuator 424 raises second frame 423 from second flat position 506 to second bow position 508, second frame 423 presses upward against collar 560 to lift second gripper 426. Several collars may be attached to multi-axis shafts 432 at respective locations between first flat position 502 and first bow position 504, or second flat position 506 and second bow position 508. Accordingly, when first frame 417 is raised from first flat position 502 to first bow position 504, first frame 417 may press upward on a collar 560 to raise a multi-axis gripper 430, and when second frame 423 is raised from second flat position 506 to second bow position 508, second frame 423 may press upward on another collar 560 to raise the multi-axis gripper 430.

The actuation scheme may include other types of actuators and actuation mechanisms. For example, linkage systems may be devised to perform a similar function to the collars 560 described above. Furthermore, more than one actuator may be coupled to a frame or a gripper shaft. For example, first frame 417 may be mounted on a pair of laterally separated actuators to resist a turning moment caused by a weight of first frame 417 and reduce a likelihood of binding of the system. Similarly, each gripper 204 may be associated with an individual actuator to allow the grippers 204 to be individually moved and achieve a fully controllable and customizable curvature of wafer 100 during the flattening process.

Figure 8:
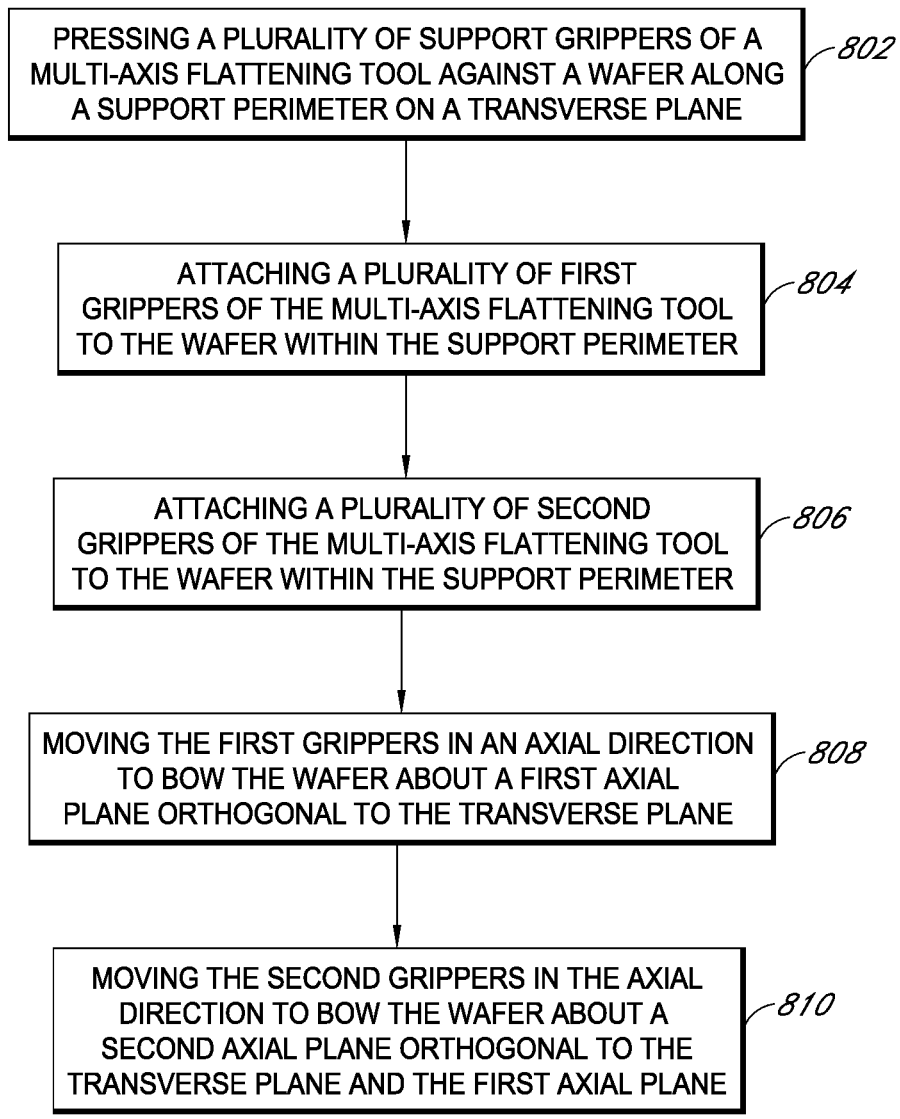
FIG. 8 illustrates a method of flattening a wafer using a multi-axis flattening tool, in accordance with an embodiment of the present disclosure.

Referring to FIG. 8, a method of flattening a wafer using a multi-axis flattening tool is shown in accordance with an embodiment of the present disclosure. The method provides for biaxial flattening of a bowed wafer 100. The bowed wafer 100 may initially be held in a flat shape by a separate vacuum chuck station. For example, silicon substrate 102 of wafer 100 may be gripped by a flat vacuum belt such that the concave upward metallization layer 104 is flattened and faces upward along axial direction 410.

At operation 802, multi-axis flattening tool 400 may be lowered onto metallization layer 104 of wafer 100. More particularly, a vertical actuator connected to a vertical column of support frame 408 may lower support frame 408, and support grippers 414 may be lowered onto an upper surface of wafer 100. Accordingly, support grippers 414 may press against wafer 100 along support perimeter 602 on transverse plane 416. Support grippers 414 optionally include vacuum cups 704, and thus, suction may be applied through vacuum ports 710 of support grippers 414 to attach support grippers 414 to the wafer surface. Optionally, support grippers 414 may not actively grip the wafer surface, but may include a frictional surface, e.g., a rubber tip, to grip the wafer surface by friction when a vertical load is applied to the wafer surface by first grippers 420, second grippers 426, or multi-axis grippers 430.

At operation 804, first grippers 420 may attach to wafer 100 within support perimeter 602. For example, all of the grippers 204 of multi-axis flattening tool 400 may be coplanar when support frame 408 is lowered toward wafer 100, and thus, first grippers 420 may press against wafer 100 at the same time as support grippers 414. Suction may be applied through vacuum ports 710 of first grippers 420 to attach first grippers 420 to the wafer surface.

At operation 806, second grippers 426 may attach to wafer 100 within support perimeter 602. Second grippers 426 may press against wafer 100 at the same time as support grippers 414 and first grippers 420, and suction may be applied through vacuum ports 710 of second grippers 426 to attach second grippers 426 to the wafer surface. In an embodiment, the method includes attaching multi-axis grippers 430 to wafer 100 within multi-axis perimeter 608. Multi-axis grippers 430 may press against wafer 100 at the same time as support grippers 414, first grippers 420, and second grippers 426, and suction may be applied through vacuum ports 710 of multi-axis grippers 430 to attach multi-axis grippers 430 to the wafer surface. Accordingly, a foil side of wafer 100 may be gripped by support grippers 414, first grippers 420, second grippers 426, and/or multi-axis grippers 430.

At operation 808, first grippers 420 may be moved in an axial direction 410 to bow wafer 100 about first axial plane 106. More particularly, first actuator 418 may extend to push upward against the plate structure of first frame 417, and to move first frame 417 relative to support frame 408, e.g., to drive first frame 417 away from support frame 408. In an embodiment, as first frame 417 is raised by first actuator 418, the plate structure engages collars on first shafts 422 to lift first grippers 420 relative to support grippers 414. Similarly, the plate structure may engage collars on multi-axis shafts 432 to lift multi-axis grippers 430 relative to support grippers 414 in axial direction 410 when first actuator 418 is actuated. Accordingly, first set of grippers 604 may be lifted to cause wafer 100 to bow or curve about first axial plane 106 in an opposite direction of the residual curvature in metallization layer 104. The wafer 100 may be bent above transverse plane 416 to cause plastic deformation of metallization layer 104. As such, residual stresses about first axial plane 106 may be relieved by a first flattening operation about first axial plane 106.

It is noted that, although multi-axis flattening tool 400 has been described as lifting grippers 204 relative to support grippers 414 to bend wafer 100, grippers 204 may instead be pushed downward relative to support grippers 414 to cause bending in an opposite direction. Accordingly, the description is intended to be illustrative and not limiting with respect to this functionality. After bending wafer 100 about first axial plane 106, first actuator 418 may shorten to lower first frame 417 such that first grippers 420 and multi-axis grippers 430 return to a coplanar relationship with support grippers 414 and second grippers 426. A residual curvature of wafer 100, after reducing stress in the first direction, may shift such that wafer 100 bows about second axial plane 108 instead of first axial plane 106.

At operation 810, second grippers 426 may be moved in an axial direction 410 to bow wafer 100 about second axial plane 108. More particularly, second actuator 424 may extend to push upward against the plate structure of second frame 423, and to move second frame 423 relative to support frame 408, e.g., to drive second frame 423 away from support frame 408. In an embodiment, as second frame 423 is raised by second actuator 424, the plate structure engages collars on second shafts 428 to lift second grippers 426 relative to support grippers 414. Similarly, the plate structure may engage collars on multi-axis shafts 432 to lift multi-axis grippers 430 relative to support grippers 414 in axial direction 410 when second actuator 424 is actuated. Accordingly, second set of grippers 606 may be lifted to cause wafer 100 to bow or curve about second axial plane 108 in an opposite direction of the residual curvature in metallization layer 104. The wafer 100 may be bent above transverse plane 416 to cause plastic deformation of metallization layer 104. As such, residual stresses about second axial plane 108 may be relieved by a second flattening operation about second axial plane 108.

Multi-axis flattening tools and methods useful for flattening bowed wafers have been described. Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A multi-axis flattening tool, comprising:
a support structure including a plurality of support grippers arranged along a support perimeter on a transverse plane;
a first flattening structure coupled to the support structure by a first actuator, wherein the first flattening structure includes a plurality of first grippers arranged within the support perimeter about a first axial plane orthogonal to the transverse plane; and
a second flattening structure coupled to the support structure by a second actuator, wherein the second flattening structure includes a plurality of second grippers arranged within the support perimeter about a second axial plane orthogonal to the transverse plane and the first axial plane, wherein the second flattening structure is positioned over the first flattening structure with respect to the support structure.

2. The multi-axis flattening tool of claim 1, wherein the first flattening structure includes a first frame having a first flat position and a first bow position relative to a support frame of the support structure, wherein the first grippers are coplanar with the support grippers when the first frame is in the first flat position, and wherein the first grippers are axially offset from the support grippers when the first frame is in the first bow position.

3. The multi-axis flattening tool of claim 2, wherein the second flattening structure includes a second frame having a second flat position and a second bow position relative to the support frame of the support structure, wherein the second grippers are coplanar with the support grippers when the second frame is in the second flat position, and wherein the second grippers are axially offset from the support grippers when the second frame is in the second bow position.

4. The multi-axis flattening tool of claim 3, wherein the first grippers include at least four first grippers arranged symmetrically about the first axial plane, and wherein the second grippers include at least four second grippers arranged symmetrically about the second axial plane.

5. The multi-axis flattening tool of claim 3, wherein the first grippers and the second grippers are arranged along a multi-axis perimeter within the support perimeter, and the multi-axis flattening tool further comprising a plurality of multi-axis grippers arranged within the multi-axis perimeter about the first axial plane and the second axial plane.

6. The multi-axis flattening tool of claim 5, wherein the support frame is coupled to the support grippers by one or more support shafts, wherein the first frame is coupled to the first grippers by one or more first shafts, wherein the second frame is coupled to the second grippers by one or more second shafts, and wherein the multi-axis grippers are coupled to both the first frame and the second frame by one or more multi-axis shafts.

7. The multi-axis flattening tool of claim 6 further comprising one or more springs extending from the support frame to one or more of the support grippers, the first grippers, the second grippers, or the multi-axis grippers.

8. The multi-axis flattening tool of claim 6, wherein one or more of the support grippers, the first grippers, the second grippers, or the multi-axis grippers include a vacuum cup.

9. The multi-axis flattening tool of claim 8, wherein the vacuum cup includes a bellows having a plurality of folds, and wherein the vacuum cup is coupled to a vacuum source through a lumen extending through a respective one or more of the support shafts, the first shafts, the second shafts, or the multi-axis shafts.

10. A multi-axis flattening tool, comprising:
a support structure including a set of support grippers arranged along a support perimeter on a transverse plane;
a first set of grippers arranged within the support perimeter about a first axial plane, wherein the first axial plane is orthogonal to the transverse plane;
a second set of grippers arranged within the support perimeter about a second axial plane, wherein the second axial plane is orthogonal to the transverse plane and the first axial plane;
first and second actuators, each actuator coupled to a respective one of the first set or the second set of grippers; and
first and second flattening structures coupled to the support structure, the second flattening structure positioned over the first flattening structure with respect to the support structure.

11. The multi-axis flattening tool of claim 10, wherein a multi-axis perimeter extends through one or more grippers of the first set and the second set of grippers.

12. The multi-axis flattening tool of claim 11, wherein the support structure includes a support frame coupled to the support grippers; the first flattening structure includes a first frame coupled to the first set of grippers by the first actuator; and the second flattening structure includes a second frame coupled to the second set of grippers by the second actuator.

13. The multi-axis flattening tool of claim 12, wherein the first set of grippers includes at least eight grippers arranged symmetrically about the first axial plane, and wherein the second set of grippers includes at least eight grippers arranged symmetrically about the second axial plane.

14. The multi-axis flattening tool of claim 13, wherein one or more of the support grippers, the first set of grippers, or the second set of grippers include a vacuum cup.

15. A method, comprising:
pressing a plurality of support grippers of a multi-axis flattening tool against a wafer, wherein the support grippers press against the wafer along a support perimeter on a transverse plane, the multi-axis flattening tool comprising first and second flattening structures coupled to a support structure, the second flattening structure positioned over the first flattening structure with respect to the support structure;
attaching a plurality of first grippers of the multi-axis flattening tool to the wafer within the support perimeter;
attaching a plurality of second grippers of the multi-axis flattening tool to the wafer within the support perimeter;
moving the first grippers in an axial direction to bow the wafer about a first axial plane orthogonal to the transverse plane; and
moving the second grippers in the axial direction to bow the wafer about a second axial plane orthogonal to the transverse plane and the first axial plane.

16. The method of claim 15, wherein the multi-axis flattening tool includes a support frame of the support structure coupled to a first frame of the first flattening structure by a first actuator, wherein the support frame is coupled to the support grippers and the first frame is coupled to the first grippers, and wherein moving the first grippers includes actuating the first actuator to move the first frame relative to the support frame.

17. The method of claim 16, wherein the multi-axis flattening tool includes a second frame of the second flattening structure coupled to the support frame by a second actuator, wherein the second frame is coupled to the second grippers, and wherein moving the second grippers includes actuating the second actuator to move the second frame relative to the support frame.

18. The method of claim 17 further comprising:
attaching a plurality of multi-axis grippers of the multi-axis flattening tool to the wafer, wherein the multi-axis grippers are coupled to the first frame and the second frame;
actuating the first actuator to move the multi-axis grippers in the axial direction to bow the wafer about the first axial plane; and
actuating the second actuator to move the multi-axis grippers in the axial direction to bow the wafer about the second axial plane.

19. The method of claim 18, wherein one or more of the support grippers, the first grippers, the second grippers, or the multi-axis grippers include a vacuum cup, and wherein attaching the one or more of the first grippers, the second grippers, or the multi-axis grippers to the wafer includes applying suction to the vacuum cup.

20. The method of claim 19, wherein the vacuum cup includes a bellows having a plurality of folds, and wherein the vacuum cup is in fluid communication with a vacuum source through a shaft extending from one or more of the support frame, the first frame, or the second frame to the vacuum cup.

* * * * *